United States Patent
Genova et al.

(10) Patent No.: US 6,870,735 B2
(45) Date of Patent: Mar. 22, 2005

(54) HEAT SINK WITH VISIBLE LOGO

(75) Inventors: Ronald R. Genova, Reading, PA (US); Duane S. Stackhouse, Coopersburg, PA (US)

(73) Assignee: JDS Uniphase Corporation, San Jose, CA (US)

(*) Notice: Subject to any disclaimer, the term of this patent is extended or adjusted under 35 U.S.C. 154(b) by 50 days.

(21) Appl. No.: 10/396,908

(22) Filed: Mar. 25, 2003

(65) Prior Publication Data

US 2004/0190256 A1 Sep. 30, 2004

(51) Int. Cl.[7] ................................................ H05H 7/20
(52) U.S. Cl. ..................... 361/690; D13/184; D13/179; 165/185; 165/80.3; 257/722; 361/703; 361/715
(58) Field of Search ............................. D13/110, 184, D13/179; D14/188; 165/80.2–80.4, 185; 174/16.3; 257/722, 712–713, 706–707; 361/600, 679, 688–690, 694–695, 703–710, 715

(56) References Cited

U.S. PATENT DOCUMENTS

| | | | |
|---|---|---|---|
| 5,499,450 A | | 3/1996 | Jacoby |
| 5,547,272 A | * | 8/1996 | Paterson et al. .......... 312/223.2 |
| 5,625,228 A | * | 4/1997 | Rogren ........................ 257/712 |
| D381,011 S | | 7/1997 | Widmayer et al. ................ 13/3 |
| D387,333 S | | 12/1997 | Pellow et al. ..................... 13/3 |
| D398,589 S | | 9/1998 | Dodson ............................ 13/3 |
| D400,188 S | | 10/1998 | Chu ................................. 13/3 |
| D401,225 S | | 11/1998 | Maack et al. ..................... 13/3 |
| D425,493 S | * | 5/2000 | Cutright et al. ............ D13/184 |
| 6,108,194 A | * | 8/2000 | Seligman et al. ........... 361/600 |
| D449,587 S | | 10/2001 | Cronin ............................. 13/3 |
| 6,343,016 B1 | | 1/2002 | Lin |
| D464,939 S | | 10/2002 | Chuang et al. .................. 13/3 |
| 6,460,609 B1 | | 10/2002 | Cho et al. |
| 6,466,444 B2 | | 10/2002 | Cheung |
| 6,504,095 B1 | * | 1/2003 | Hoffstrom .................. 174/52.1 |
| 6,552,899 B2 | * | 4/2003 | Ronzani et al. ............. 361/687 |

OTHER PUBLICATIONS

"OCZ Enahnced Latency PC–3500" from The Tech Zone—The Very Latest in Computer Hardware News and Reviews—www.thetechzone.com, Jan. 30, 2003.

* cited by examiner

Primary Examiner—Gregory Thompson
(74) Attorney, Agent, or Firm—Allen, Dyer, Doppelt, Milbrath & Gilchrist, P.A.

(57) ABSTRACT

A heat sink is for an element to be cooled has a thermally conductive base and a plurality of thermally conductive pins or fins extending substantially perpendicular from the base, said pins or fins being arranged in a predetermined pattern. The pins at least partially frame thermally conductive projections extending substantially perpendicular from said base which forming a discernable logo having an upper surface and sides for providing plural cooling surfaces. In this instance the 3-D logo performs cooling of the components within a package.

13 Claims, 5 Drawing Sheets

HEAT SINK WITH VISIBLE LOGO

FIELD OF THE INVENTION

This invention relates to heat sinks and more particularly, to heat sinks having an identifier within a heat sinking area adapted for use with electronic or opto-electronic circuits.

BACKGROUND OF THE INVENTION

As circuit modules and integrated circuit packages and devices have become smaller, with shorter circuit traces and increased internal signal speeds, greater power density has resulted, causing increased heating of the devices and a need for improved heat sinking and better thermal management. Three methods are commonly employed for providing such thermal management. These methods are natural convection, which relies on air flow for cooling without any external forces applied to the air; forced convection where fans or blowers move air in a direction parallel to the surface of the element from which heat is being removed; and impingement cooling where the air is blown at the element to be cooled in a direction perpendicular to its surface.

Typically, heat sinks are provided with each of the three methods to improve the removal of heat from the element. While cooling fins or vanes have been employed for this purpose, cooling pins are preferably utilized with small elements, such as integrated circuits, because of their superior performance for a given volume.

Numerous pin-type heat sinks are currently on the market including many designed for use with integrated circuits. However, there are various problems unique to integrated circuits which are not fully addressed by existing devices. First, the heat generated by certain circuits may be greatest in particular locations. For this reason, it is advantageous to have a heat sink which allows different amounts of cooling in different regions. Even the heat generated within a particular circuit within a circuit module may vary.

Therefore providing a heat sink with variable cooling across its surface can be advantageous. Another problem with modules having an upper surface covered by heat sinking pins is that there may be little or no space in which to place an identifier such as a logo or other indicia thereon. The absence of projections such as pins or fins on a cooling surface would obviously provide less cooling surface area; heretofore the only known solution to the applicant was to place an identifier such as a logo on the flat surface in the from of a flat sticker.

It is an object of this invention to provide a solution to combining an identifier such as a logo, company name, or insignia, on a heat sink.

It is an object of this invention to provide a logo which offers heat sinking or cooling ability greater than that of the area of the base it covers.

It is an object of the invention to provide a heat sink for cooling an electronic component, wherein the heat sink has cooling pins or for example vane-like fins and a cooling logo.

SUMMARY OF THE INVENTION

In accordance with this invention, a heat sink is provided for an element to be cooled comprising:
  a thermally conductive base;
  a plurality of thermally conductive pins or fins extending substantially perpendicular from the base, said pins or fins being arranged in a predetermined pattern; and
  at least one thermally conductive projection extending substantially perpendicular from said base at least partially framed by said pins or fins forming a discernable logo having an upper surface and sides for providing plural cooling surfaces.

The term logo used herein is to mean an identifier, which can be in the form of an emblem or text to identify for example, a company or product name.

In accordance with the invention there is further provided, a heat sink having pins protruding from a base for cooling, wherein the pins frame in a region having a logo projecting from the base for providing cooling of a hot region.

The invention disclosed herein relating to the mechanical integration of a logo, for example a company logo, such as that representing JDS Uniphase, i.e. the JDSU logo into a product's heat dissipation heatsink apparatus is novel and conveniently performs a functional task of dissipating heat and disrupting airflow patterns further improving heat dissipation of the pinned heat sink and hence the thermal performance of an opto-electronic module while at the same time establishing unique brand identity. To the inventor's knowledge, this is the first time a mechanical logo performs such a functional task.

BRIEF DESCRIPTION OF THE DRAWINGS

Exemplary embodiments of the invention will now be described in conjunction with the drawings in which.

DETAILED DESCRIPTION

Figure 1:
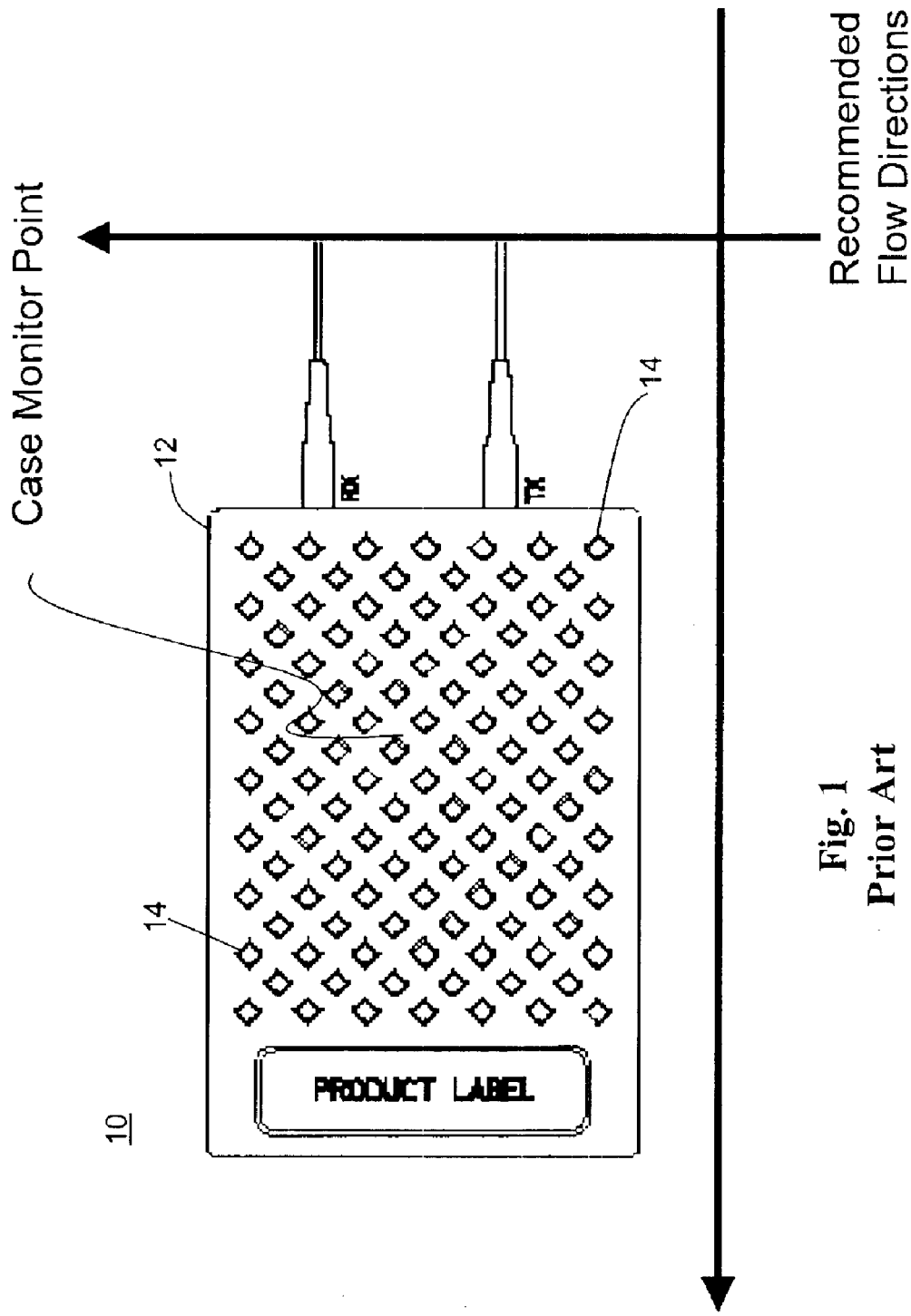
FIG. 1 is a top view of a prior art heat sinking lid of an optoelectronic component.

Turning now to FIG. 1 a lid 12 of a heat sink is shown, having a plurality of protruding thermally conductive pins 14 arranged across the lid in a predetermined pattern of staggered rows. The lid 12 is shown to be a cover for an opto-electronic transceiver module 10 having shrouded receive and transmit optical input and output optical fiber leads, respectively at an edge of the module. A flat region absent any pins 12 about an edge of the module supports a product label. In some instances, where more pins are required, the region supporting the product label could be used, however the product label would have to be placed elsewhere, such as along an un-pinned edge of the module.

Figure 2:
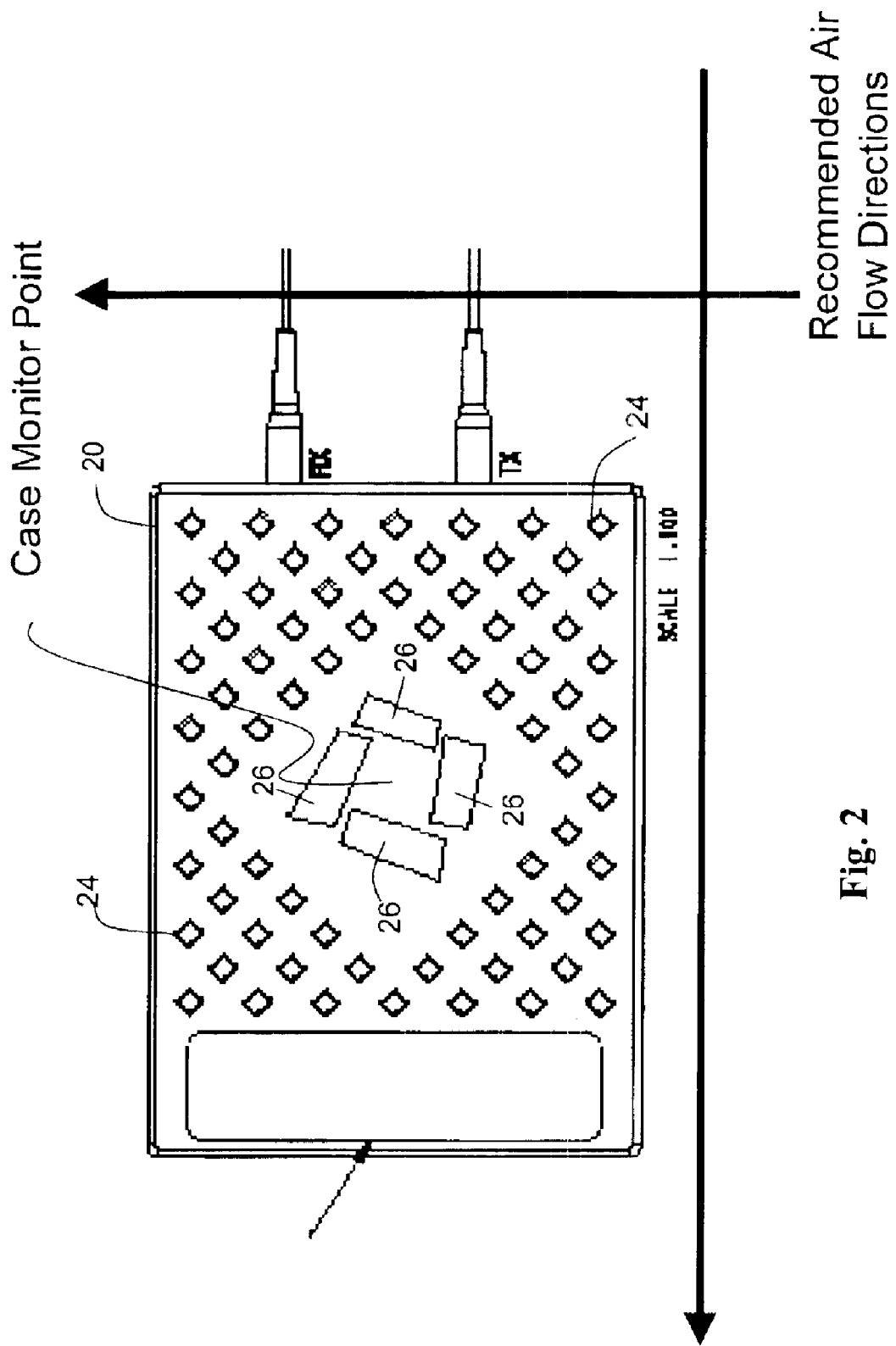
FIG. 2 is a top view of a heat sinking lid in accordance with this invention, wherein a company logo itself forms a heat sinking member.

FIG. 2 is an illustration of an improved lid 20, in accordance with the invention, wherein thermally conductive pins 24 are disposed in a predetermined pattern, and a raised thermally conductive logo 26 is disposed substantially in the center of the lid being framed by pins 18. The logo 26 can be made of the same thermally conductive material as the pins and the lid, or can be made of a material that is more, or less thermally conductive than the pins, in accordance with required cooling parameters. Conveniently, if the logo is formed of a different material, for example, having a different colour, the logo would visually stand out more from the thermally conductive pins which frame it. The logo could also be positioned near an edge or end of the lid.

Test results have indicated that the lid with the presence of the logo has superior thermal performance than the prior art lid of FIG. 1 absent the logo. Therefore two significant advantages are provided by the inclusion of the logo; enhanced cooling, and product or brand identification.

It is believed that even if the logo provided a lesser cooling ability than having pins in place of the logo, its use as a brand or product indicator would be useful as long at it provided adequate thermal conduction. In this instance, the added benefit of better cooling was an unexpected advantage.

Although in the preferred embodiment shown, the cooling lid covers an opto-electronic component, this invention can extend to many other types of electronic packages requiring a heat sink and heat sinking indicia such as a logo.

Figure 3:
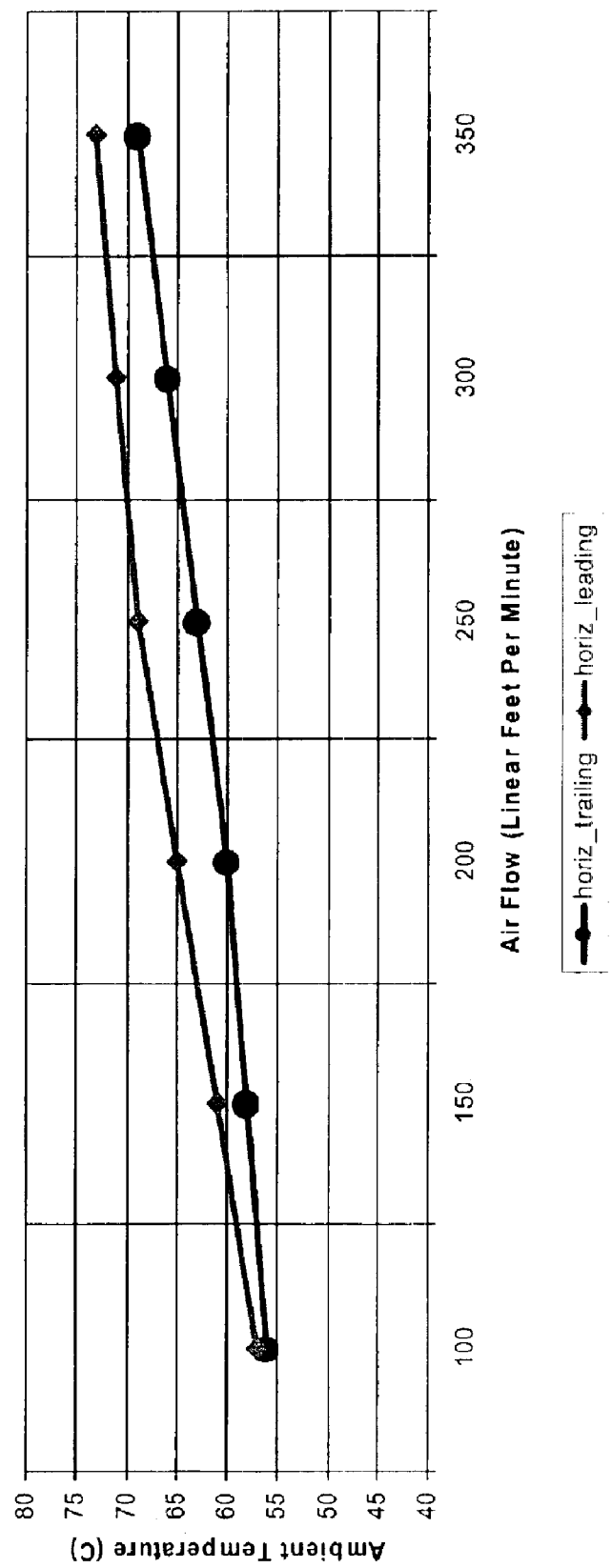
FIG. 3 is a graph relating to the thermal performance of the prior art heat sink shown in FIG. 1 depicting airflow versus ambient temperature.
Figure 4:
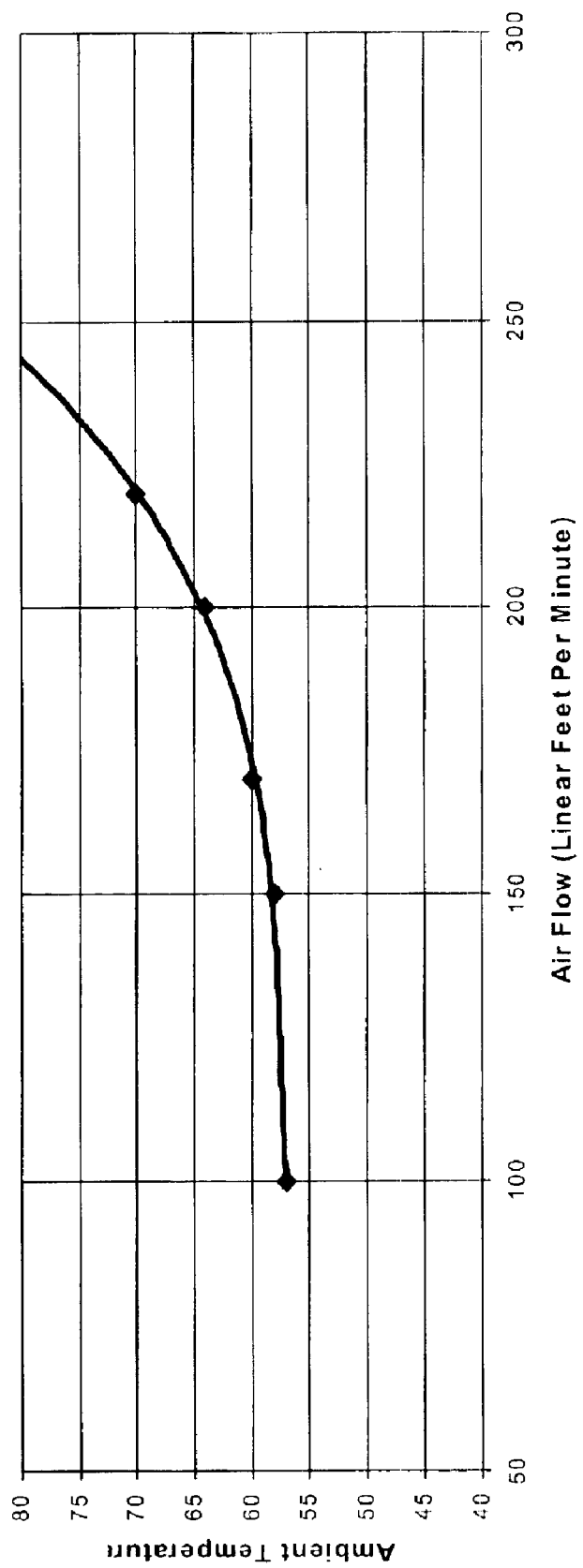
FIG. 4 is a graph relating to the thermal performance of the heat sink shown in FIG. 2 depicting airflow versus ambient temperature.
Figure 5:
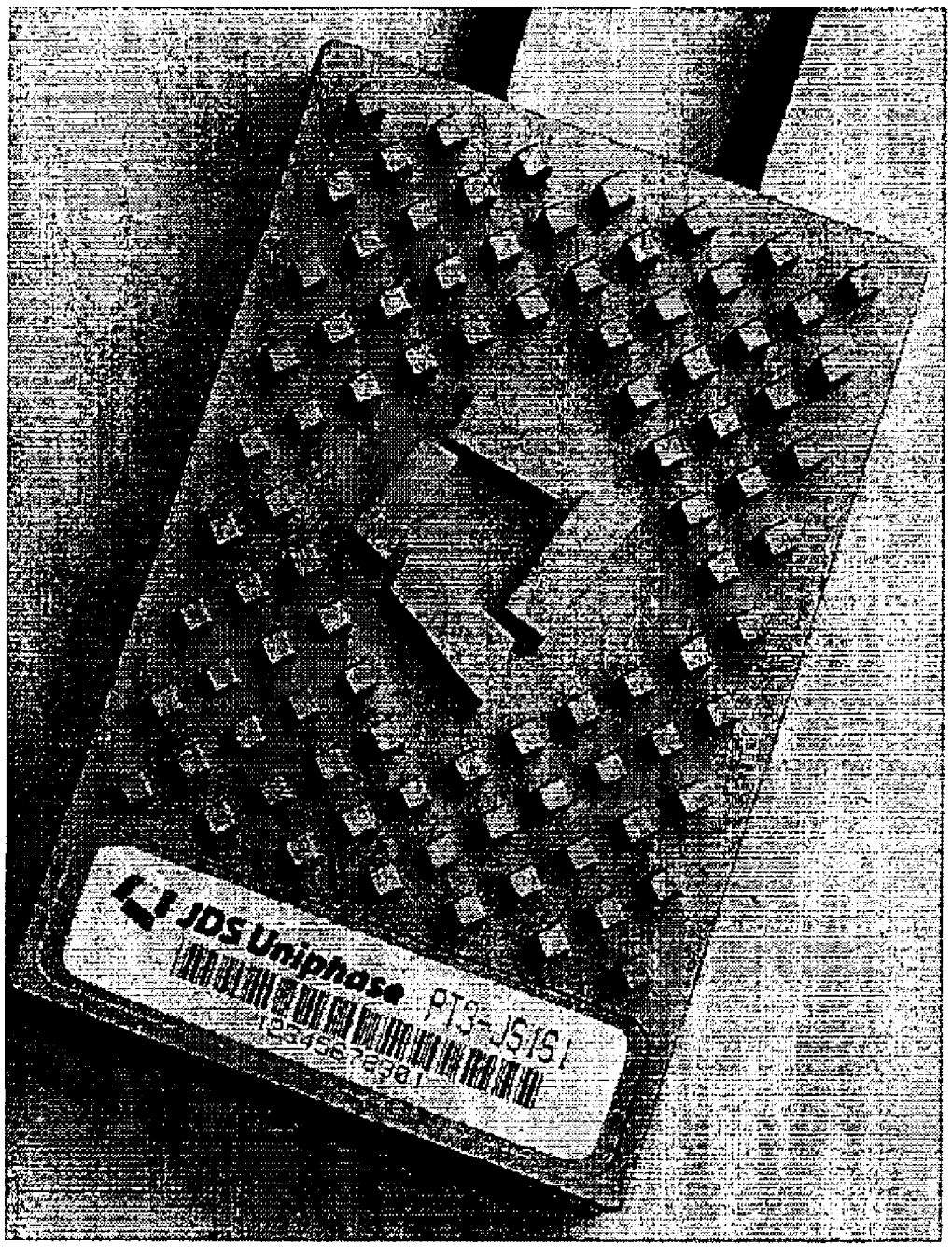
FIG. 5 is a more detailed top view of FIG. 2.

Turning now to FIGS. 3 and 4, plots are shown for the thermal characteristics of the prior art lid and for the lid in accordance with the invention respectively. In FIGS. 3 and 4 maintaining a same centrally disposed monitor point on the lid while maintaining a temperature of 70 degrees C. at that location, the airflow required is shown. For example, for the device in FIG. 3, when the ambient temperature reached 65–70 degrees C., the required airflow was approximately 300 linear feet per minute. In contrast, in FIG. 4, corresponding to the heat sink with the logo, when the ambient temperature was 65–70 degrees C., the required airflow was less than 225 linear feet per minute which is a substantial improvement over the prior art heat sink.

Although the JDSU™ logo shown in the exemplary embodiment provides superior results and brand identification, other logos and means of providing differentiation from surrounding pins can envisaged. For example thicker pins, taller pins or lower pins in the form of a logo can be used to distinguish from the pattern of heat sinking pins disposed thereabout as a frame or partial frame.

Of course, numerous other embodiments may be envisaged, without departing from the spirit and scope of the invention.

What is claimed is:

1. A heat sink for an element to be cooled comprising:
   a thermally conductive base;
   a plurality of thermally conductive pins or fins extending substantially perpendicular from the base, said pins or fins being arranged in a predetermined pattern; and
   at least one thermally conductive projection extending substantially perpendicular from said base at least partially framed by said pins or fins forming a discernable logo having an upper surface and sides for providing plural cooling surfaces, positioned for disrupting airflow through the pins or fins, thereby assisting in dissipating heat.

2. A heat sink as defined in claim 1, wherein the discernable logo is framed on all sides by the a plurality of the thermally conductive pins or fins.

3. A heat sink as defined in claim 2, wherein the logo is comprised of a plurality of distinct projections each for providing cooling and for forming the discernable logo positioned substantially in the center of the thermally conductive base.

4. A heat sink as defined in claim 3, wherein the pins or fins and the logo are of a same metallic material.

5. A heat sink as defined in claim 2, wherein the pins or fins and the logo project from said thermally conductive base at a same height.

6. A heat sink as defined in claim 2, wherein the height of the pins or fins and the height of the logo projecting from said thermally conductive base are different thereby increasing visual differentiation.

7. A heat sink as defined in claim 2, wherein the pins or fins are a different material from that of the projecting logo.

8. A heat sink as defined in claim 2, wherein the pins or fins are a different colour than the projecting logo.

9. A heat sink as defined in claim 3, wherein the logo is comprised of pins or fins that are visually distinguishable from said other pins or fins.

10. An opto-electronic or an electronic module comprising:
    a housing for supporting opto-electronic or electronic components; and
    a heat dissipating cover for dissipating heat generated by the components;
    wherein the heat dissipating cover includes:
        a thermally conductive base;
        a plurality of thermally conductive pins extending from the base, said pins being arranged in a predetermined pattern; and
        at least one thermally conductive projection extending substantially perpendicular from said base at least partially framed by said pins or fins forming a discernible logo having an upper surface and sides for providing plural cooling surfaces positioned for disrupting airflow through the pins, thereby assisting in dissipating heat.

11. An opto-electronic or an electronic module as defined in claim 10 wherein the plurality of thermally conductive pins extend substantially perpendicular from the base.

12. An opto-electronic or an electronic module as defined in claim 10, wherein the discernable logo is disposed in the center of the thermally conductive base framed by the pins on all sides to disrupt airflow through the pins, thereby assisting in dissipating heat.

13. A heat sink for forming a cover of an electronic module having heat dissipating components therein, comprising:
    a substrate having pins integral therewith and protruding therefrom, and having a logo integral therewith, wherein the logo, the pins and the substrate are all formed of a same thermally conducting metallic material, the pins at least partially bordering said logo, the logo having a heat dissipating upper surface and sides protruding from the substrate, said logo defining a three dimensional structure visually representing information and for providing a medium for thermal conduction positioned for disrupting airflow through the pins, thereby assisting in dissipating heat.

* * * * *